(12) United States Patent
Colburn et al.

(10) Patent No.: US 11,249,242 B1
(45) Date of Patent: Feb. 15, 2022

(54) HIGH REFRACTIVE INDEX GRATINGS FOR WAVEGUIDE DISPLAYS MANUFACTURED BY SELF-ALIGNED STACKED PROCESS

(71) Applicant: Facebook Technologies, LLC, Menlo Park, CA (US)

(72) Inventors: Matthew E. Colburn, Woodinville, WA (US); Giuseppe Calafiore, Redmond, WA (US); Matthieu Charles Raoul Leibovici, Seattle, WA (US); Erik Shipton, Kirkland, WA (US); Pasi Saarikko, Kirkland, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 204 days.

(21) Appl. No.: 16/800,332

(22) Filed: Feb. 25, 2020

Related U.S. Application Data

(62) Division of application No. 15/878,016, filed on Jan. 23, 2018, now Pat. No. 10,613,268.

(Continued)

(51) Int. Cl.
*F21V 8/00* (2006.01)
*G02B 27/01* (2006.01)
(Continued)

(52) U.S. Cl.
CPC ......... *G02B 6/0065* (2013.01); *G02B 5/1809* (2013.01); *G02B 5/1857* (2013.01);
(Continued)

(58) Field of Classification Search
CPC .. G02B 6/0065; G02B 5/1809; G02B 5/1857; G03F 7/16; G03F 7/40; G03F 7/70091
See application file for complete search history.

(56) References Cited

U.S. PATENT DOCUMENTS

| 4,057,326 A | 11/1977 | Knop |
| 4,484,797 A | 11/1984 | Knop et al. |

(Continued)

FOREIGN PATENT DOCUMENTS

| JP | 02238457 A | 9/1990 |
| JP | 03283418 A | 12/1991 |
| JP | 05259068 A | 10/1993 |

OTHER PUBLICATIONS

Min, J.H. et al., "Fabrication and design of metal nano-accordion structures using atomic layer deposition and interference lithography," Nanoscale, 2015, vol. 8, pp. 4984-4990.

*Primary Examiner* — Hung Nguyen
(74) *Attorney, Agent, or Firm* — Fenwick & West LLP

(57) ABSTRACT

A manufacturing system for fabricating self-aligned grating elements with a variable refractive index includes a patterning system, a deposition system, and an etching system. The manufacturing system performs a lithographic patterning of one or more photoresists to create a stack over a substrate. The manufacturing system performs a conformal deposition of a protective coating on the stack. The manufacturing system performs a deposition of a first photoresist of a first refractive index on the protective coating. The manufacturing system performs a removal of the first photoresist to achieve a threshold value of first thickness. The manufacturing system performs a deposition of a second photoresist of a second refractive index on the first photoresist. The second refractive index is greater than the first refractive index. The manufacturing system performs a removal of the second photoresist to achieve a threshold value of second thickness to form a portion of an optical grating.

8 Claims, 9 Drawing Sheets

Related U.S. Application Data

(60) Provisional application No. 62/468,302, filed on Mar. 7, 2017.

(51) Int. Cl.
  *G02B 5/18* (2006.01)
  *G03F 7/00* (2006.01)
  *G03F 7/16* (2006.01)
  *G03F 7/40* (2006.01)
  *G03F 7/20* (2006.01)

(52) U.S. Cl.
  CPC ......... *G02B 6/0016* (2013.01); *G02B 6/0038* (2013.01); *G02B 27/0172* (2013.01); *G03F 7/001* (2013.01); *G03F 7/0005* (2013.01); *G03F 7/0035* (2013.01); *G03F 7/16* (2013.01); *G03F 7/40* (2013.01); *G03F 7/70991* (2013.01); *G02B 2027/0125* (2013.01)

(56) References Cited

U.S. PATENT DOCUMENTS

| | | | |
|---|---|---|---|
| 6,746,890 B2 * | 6/2004 | Gupta | A61B 17/12022 |
| | | | 438/50 |
| 6,917,471 B2 | 7/2005 | Shiozaki et al. | |
| 7,554,734 B1 | 6/2009 | Holm et al. | |
| 2005/0247566 A1 * | 11/2005 | Stevens | H01L 21/76801 |
| | | | 205/118 |
| 2006/0141385 A1 | 6/2006 | Kaule | |
| 2007/0081246 A1 | 4/2007 | Stuck et al. | |
| 2007/0263285 A1 | 11/2007 | Walter et al. | |
| 2007/0279745 A1 | 12/2007 | Klemann | |
| 2009/0041971 A1 | 2/2009 | Wang et al. | |
| 2009/0263071 A1 | 10/2009 | Stuck et al. | |
| 2010/0091369 A1 | 4/2010 | Hoose | |
| 2012/0162771 A1 | 6/2012 | Walter et al. | |
| 2015/0253570 A1 | 9/2015 | Sunnari et al. | |
| 2017/0205547 A1 | 7/2017 | Lochbihler | |
| 2018/0047645 A1 * | 2/2018 | Varadarajan | C23C 16/54 |
| 2018/0081176 A1 | 3/2018 | Olkkonen et al. | |

* cited by examiner

HIGH REFRACTIVE INDEX GRATINGS FOR WAVEGUIDE DISPLAYS MANUFACTURED BY SELF-ALIGNED STACKED PROCESS

CROSS REFERENCE TO RELATED APPLICATIONS

This application is a division of co-pending U.S. application Ser. No. 15/878,016, filed Jan. 23, 2018, which claims the benefit of U.S. Provisional Application No. 62/468,302, filed Mar. 7, 2017, each of which is incorporated by reference in its entirety.

BACKGROUND

The present disclosure generally relates to waveguide displays, and specifically to manufacturing grating elements that have a high refractive index based on a self-aligning stacking of materials.

Near-eye light field displays project images directly into a user's eye, encompassing both near-eye displays (NEDs) and electronic viewfinders. Conventional near-eye displays (NEDs) generally have a display element that generates image light that passes through one or more lenses before reaching the user's eyes. Additionally, NEDs in augmented reality systems are typically required to be compact and light weight, and to provide large exit pupil with a wide field-of-vision for ease of use. However, designing a conventional NED with materials of desired optical properties often results in a very low out-coupling efficiency of the image light received by the user's eyes due to a low refractive index. Accordingly, there is a lack of a manufacturing system to fabricate such NEDs with a high throughput in a self-aligned fashion.

SUMMARY

Embodiments relate to a method of manufacturing an optical grating for an optical waveguide. In some embodiments, the manufacturing system for fabricating the optical grating includes a patterning system, a deposition system, and an etching system. The manufacturing system performs a lithographic patterning of one or more photoresists to create a stack over a substrate. The manufacturing system performs a conformal deposition of a protective coating on the stack.

The manufacturing system performs a deposition of a first photoresist of a first refractive index on the protective coating. The manufacturing system performs a removal of the first photoresist to achieve a threshold value of first thickness. The manufacturing system performs a deposition of a second photoresist of a second refractive index on the first photoresist. The second refractive index is greater than the first refractive index. The manufacturing system performs a removal of the second photoresist to achieve a threshold value of second thickness to form a portion of an optical grating. The portion of the optical grating may be a partially complete optical grating, or complete optical grating that, e.g., couples light into an optical waveguide. In some embodiments, the manufacturing system performs a deposition of a third photoresist of a third refractive index on the second photoresist. The manufacturing system performs a removal of the third photoresist to achieve a threshold value of third thickness. The manufacturing system performs a deposition of a fourth photoresist of a fourth refractive index on the third photoresist. The fourth refractive index is greater than the third refractive index. The manufacturing system performs a removal of the fourth photoresist to achieve a threshold value of fourth thickness to form the optical grating.

In some configurations, the stack created over the substrate includes a first material and a second material deposited over the first material. The second material has a refractive index greater than the first material. In some embodiments, the stack includes a hard mask deposited over one or more photoresists.

In alternate embodiments, the manufacturing system performs a selective removal of a volatile photoresist in the stack created over the substrate. The manufacturing system performs the selective removal of the volatile photoresist based on a thermal decomposition process, a photolytic decomposition process, or some combination thereof.

Figure 1:
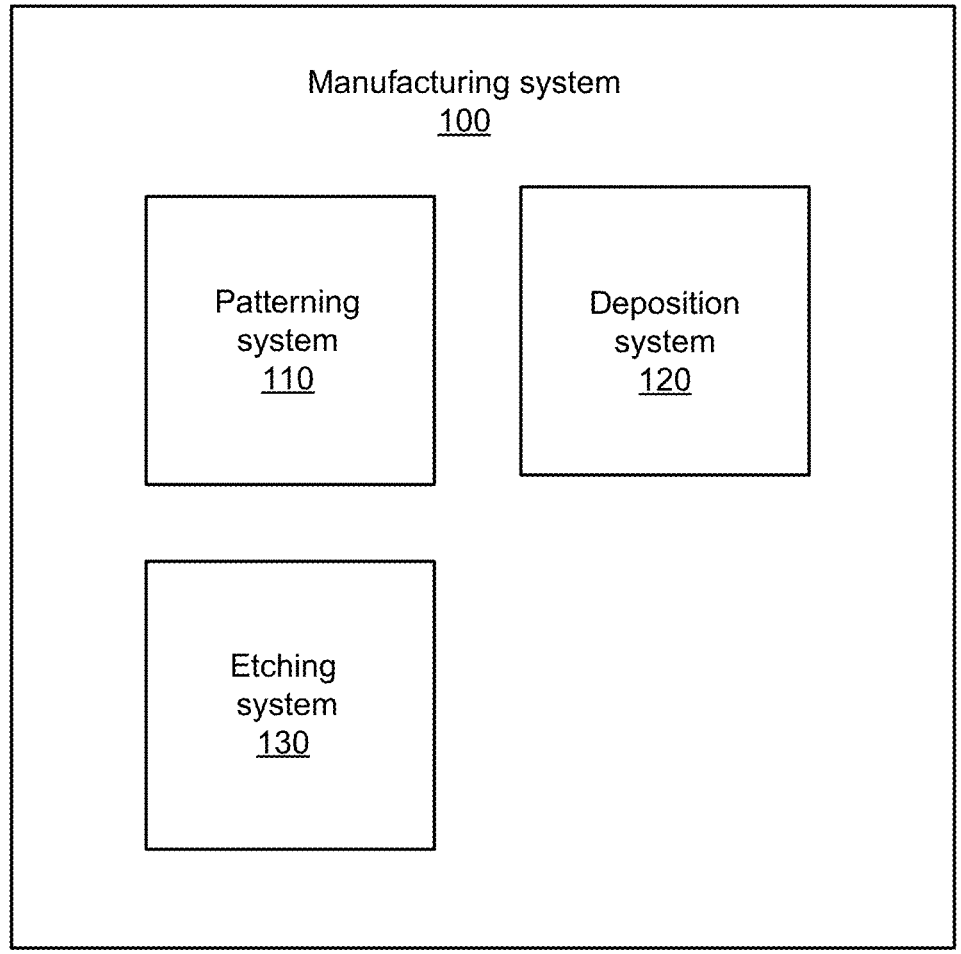
FIG. 1 is a block diagram of a manufacturing system, in accordance with one embodiment.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Overview

A manufacturing system for fabricating self-aligned optical grating elements with a variable refractive index includes a patterning system, a deposition system, and an etching system. The manufacturing system performs a self-aligned fabrication process using a single lithographic exposure that produces sub-wavelength 3D structures such as gratings, pillars, holes, etc. In some embodiments, the sub-wavelength 3D structures may have a variable refractive index. The sub-wavelength 3D structures may also be referred to as an "optical grating." The optical grating may be created from a stack composed of a plurality of layers of alternating materials of different refractive indices created over a substrate. In one example, the substrate is an optical waveguide. The manufacturing system produces an optical grating, including but not restricted to, a diffraction grating, a holographic grating, a holographic reflector, or some other optical component that couples image light into the optical waveguide. In some configurations, the manufacturing system fabricates a portion of the optical grating composed of a first layer and a second layer of alternating materials.

In some embodiments, the manufacturing system fabricates a stack of high and low index materials patterned lithographically on a base substrate. The manufacturing system etches the high and low index materials after a single lithographic patterning. The manufacturing system applies a protective and conformal coating on the patterned substrate. The manufacturing system deposits one or more layers of high and low index materials over the protective coating. The manufacturing system etches back the low and high index materials to produce the sub-wavelength 3D structures. In some configurations, the sub-wavelength 3D structures can have two or more levels of low and high index materials. In alternate configurations, the low index material may be selectively removed based on a thermal process, a photolytic process, or some combination thereof.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

FIG. 1 is a block diagram of a manufacturing system 100, in accordance with one embodiment. The manufacturing system 100 is a set of systems that produces a stack with an adjustable refractive index in a waveguide display. The manufacturing system 100 includes a patterning system 110, a deposition system 120, an etching system 130, or some combination thereof. The manufacturing system 100 may be similar to a system of fabricating devices used to form an integrated circuit, and may include such components as an etching component, a thin film manufacturing component, an oxidation component, and so on. In some embodiments, the manufacturing system 100 includes a controller (not shown here) that controls each system in the manufacturing system 100.

The patterning system 110 is a system that performs a patterning of a substance formed on a substrate creating a change in geometry of the substance. In some embodiments, the patterning system 110 includes a convection oven, a hot plate, a cool plate, an infrared lamp, a wafer spinner, a mask aligner, an exposure system, a wet bench based developer system, or some combination thereof. In one example, the patterning system 110 includes a pair of convection ovens for processing batches of wafers through hard and soft baking for dehydration purposes at a temperature in the range of 150-200° C., a programmable wafer spinner, a contact-type mask aligner, and an exposure system with a mercury source of intensity close to 25 mW/cm$^2$.

In another embodiment, the patterning system 110 includes equipment performing at least one of: an electron beam lithography, an interference lithography, a multi-photon lithography, a scanning probe lithography, or some combination thereof. In a first example, the patterning system 110 is based on electron beam lithography in which a focused beam of electrons performs a scanning of a desired shape on a surface covered with an electron-sensitive film. The focused electron beam changes the solubility of the electron-sensitive film resulting in a selective removal of either the exposed or unexposed regions of the electron-sensitive film by immersing in a solvent. In a second example, the patterning system 110 is based on interference lithography in which an interference pattern consisting of a periodic series of fringes representing intensity minima and maxima between two or more coherent light waves is set up and recorded in a light sensitive material. In some configurations, the patterning system 110 includes one or more devices performing two-beam interference lithography, a three-beam interference lithography, a four-beam interference lithography, a multi-wave interference lithography, or some combination thereof. Accordingly, the patterning system 110 may perform a lithographic patterning of an array of patterns with a hexagonal symmetry, a rectangular symmetry, an aperiodic pattern with a defined spatial frequency spectrum, or some combination thereof. In a third example, the patterning system 110 is based on multi-photon lithography in which a negative-tone or positive-tone photoresists is illuminated with light from a laser of well-defined wavelength without the use of any complex optical systems. The multi-photon lithography process is based on a multi-photon absorption process in a light-sensitive material that is transparent at the wavelength of the laser for creating the lithographic pattern. By scanning and properly modulating the laser, a chemical change occurs at the focal spot of the laser and can be controlled to create an arbitrary three-dimensional periodic or non-periodic pattern. In a fourth example, the patterning system 110 is based on scanning probe lithography in which a scanning probe microscope is used for directly writing the desired lithographic pattern on a light-sensitive material using heat, chemical reaction, diffusion, oxidation, electrical bias, mechanical force, or some combination thereof. In some configurations, the patterning system 110 includes one or more devices performing lithographic patterning on a photo-sensitive material at different locations simultaneously using different types of scanning probe microscope in a parallel fashion for high volume manufacturing.

In alternate embodiments, the patterning system 110 includes an imprinting system that performs a mechanical stamping of a pattern on a substrate. In one example, the imprinting system performs a transfer of a pattern onto the substrate based on a removal of a residual polymeric layer and a subsequent removal of features imprinted into the patterned substrate. The patterning system 110 includes a thermal imprinting system, an ultraviolet imprinting system, a jet and flash imprinting system, a reverse imprinting system, or some combination thereof. The thermal imprinting system is a system that applies a mechanical force on a pre-heated stamp against a thermoplastic polymer that was previously spin-coated on the substrate. The ultraviolet imprinting system is a system that applies an ultraviolet radiation on a low-viscosity, UV-curable polymer (e.g. PDMS, HSQ) to cross-link the polymer followed by releasing the mold from the substrate. The jet and flash imprinting system is a system that dispenses the polymer on the substrate through one or more ink jets at a low pressure and temperature compared to the thermal imprinting system and the ultraviolet imprinting system. The reverse imprinting system is a system that coats a polymer directly onto a template and releases the patterned substrate by tuning the surface energies of the template and the substrate.

The deposition system 120 is a system that adds one or more thin films of materials on the substrate patterned by the patterning system 110. In some embodiments, the deposition system 120 adds a plurality of thin films of materials to form the stack with a gradient of refractive indices along any direction based on the differences between the refractive indices of two adjacent layers of materials. The deposition system 120 adds the thin films of materials on the substrate based on a physical vapor deposition, a chemical vapor deposition, an atomic layer deposition, a spin coating system, or some combination thereof, as described below in conjunction with FIG. 5. In some configurations, the deposition system 120 deposits thin films of materials selected from a group consisting of: an organic polymer, a dielectric layer, or some combination thereof. For example, the deposition system 120 deposits one or more layers of silicon di-oxide, SSQ derivatives, an organic polymer, titanium di-oxide, hafnium di-oxide, silicon nitride, or some combination thereof.

The deposition system 120 may include an electron-beam evaporator, a magnetron sputter, a reactive sputter, a low pressure chemical vapor deposition (LPCVD) reactor, a plasma-enhanced chemical vapor deposition (PECVD) reactor, an atomic layer deposition (ALD) reactor, or some combination thereof. The electron-beam evaporator is based on a form of physical vapor deposition in which a target anode is bombarded with an electron beam given off by a charged tungsten filament under high vacuum. The electron beam causes atoms from the target to transform into the gaseous phase. The atoms from the target then precipitate into a solid form, coating everything in the vacuum chamber within line of sight with a thin layer of the anode material. The magnetron sputter uses a strong electric and magnetic fields to confine charged plasma particles close to the surface of the sputter target. In a magnetic field, electrons follow helical paths around magnetic field lines, undergoing more ionizing collisions with gaseous neutrals near the target surface than would otherwise occur. The reactive sputter is based on the sputtered particles undergoing a chemical reaction before coating the substrate. The chemical reaction that the particles undergo is with a reactive gas introduced into the sputtering chamber such as oxygen or nitrogen. The low pressure chemical vapor deposition (LPCVD) reactor is based on a chemical process at a pressure lower than the atmospheric pressure in which the substrate is exposed to one or more volatile precursors which react and/or decompose on the substrate surface to produce the desired deposit. The plasma-enhanced chemical vapor deposition (PECVD) is based on a chemical process that utilizes plasma to enhance the chemical reaction rates of the volatile precursors allowing deposition at lower temperatures. In some configurations, the deposition system 120 performs the deposition of organic coatings such as plasma polymers at a temperature relatively lower than the room temperature. The atomic layer deposition (ALD) reactor is based on a chemical process in which alternating monolayers of two elements are deposited onto a substrate by alternatively pulsing the chemical reactants in a reaction chamber and then chemisorbing in a saturated manner on the surface of the substrate, forming a chemisorbed monolayer. In some configurations, the deposition system 120 includes a controller (not shown here) that controls a number of cycles of pulsing the precursors into the reaction chamber, the deposition time for each pulsing, and the time for purging the reaction chamber after each pulsing.

The etching system 130 is a system that removes one or more thin films of materials deposited on the substrate patterned by the patterning system 110. The etching system 130 is based on a physical process, a chemical process, or some combination thereof. The etching system 130 selectively removes a first set of one or more thin films of materials at a different rate of removal when compared to a second set of one or more thin films of materials in a multi-layered stack of materials deposited on the substrate. The etching system 130 includes a wet bench, an ion milling module, a plasma based reactive ion etching module, a chemical mechanical polishing module, or some combination thereof. In a first configuration, the etching system 130 includes a wet bench which performs a chemical etching using a combination of acids, bases, and solvents at a range of temperatures and concentrations. In a second configuration, the etching system 130 includes an ion milling module that performs a physical removal of a portion of the thin films deposited on the substrate at an extremely low pressure and using a high accelerating potential in order to accelerate electrons impacting the neutral gas atoms with enough energy to ionize the gas atoms. In a third configuration, the etching system 130 includes a plasma based reactive ion etching (RIE) module based on a chemically reactive plasma at a low pressure and an external electromagnetic field to remove one or more thin films of material deposited on the substrate. In a fourth configuration, the etching system 130 includes a chemical mechanical polishing (CMP) module that performs smoothening of one or more thin films of materials based on a combination of chemical and mechanical forces. In some examples, the etching system 130 uses an abrasive and corrosive chemical slurry along with a polishing pad and retaining ring to perform the chemical mechanical polishing on one or more thin films deposited on the substrate patterned by the patterning system 110.

In some embodiments, the deposition system 120 adds one or more thin film of materials of a threshold value of thickness on the substrate patterned by the patterning system 110 which can be selectively removed by the etching system 130, as described below in conjunction with FIG. 4 and FIG. 6. For example, the deposition system 120 deposits a layer of thermally labile polymers such as poly(tert-butyl acrylate), tert-butoxy esters, which can be removed by the etching system 130 based on a thermal decomposition process at high temperatures to produce isobutylene (volatile by-product) and a carboxylic acid. In another example, the deposition system 120 deposits a layer of photolytically decomposable polymers such as triphenylsulfonium triflate, triphenyl sulfonium nonaflate, or 4-Isopropyl-4'-methyldiphenyliodonium Tetrakis(pentafluorophenyl)borate which can be removed by the etching system 130 based on a photolytic decomposition.

Figure 2:
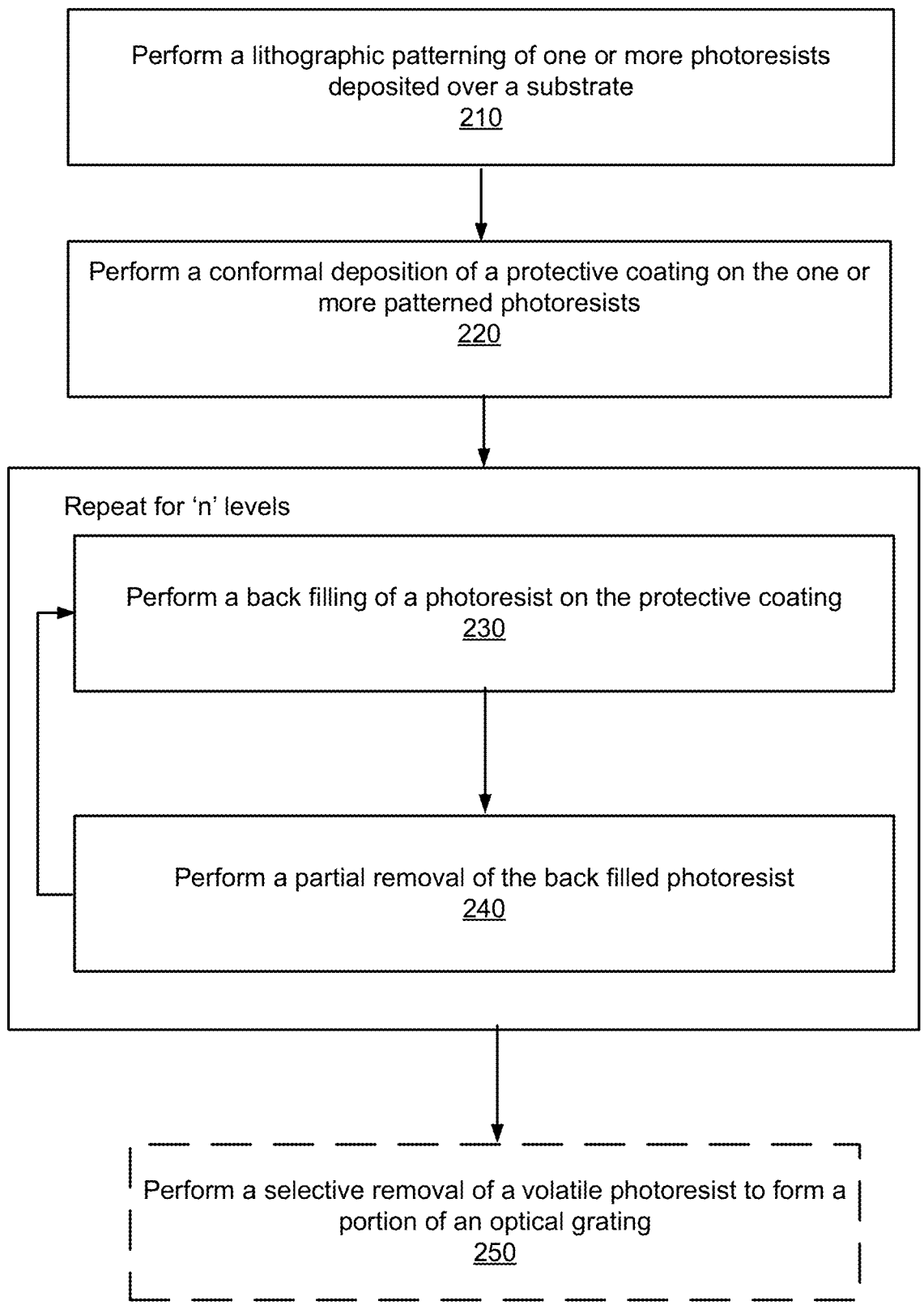
FIG. 2 is a flowchart illustrating the self-aligned stacking process performed by the manufacturing system of FIG. 1, in accordance with one embodiment.

FIG. 2 is a flowchart illustrating the self-aligned stacking process 200 performed by the manufacturing system 100 of FIG. 1, in accordance with one embodiment. Other entities may perform some or all of the steps of the process in other embodiments. Likewise, embodiments may include different and/or additional steps, or perform the steps in different orders.

The patterning system 110 performs 210 a lithographic patterning of one or more photoresists deposited on a substrate. In one example, the patterning system 110 includes a convection oven for dehydration of the substrate at 150-200° C., a wafer spinner for coating the substance on the substrate, a mask aligner for defining the lithographic pattern on the substrate, and an exposure system for transferring the lithographic pattern in the mask to the substrate. In some embodiments, the patterning system 110 performs 210 a lithographic patterning of a hard mask deposited over the one or more photoresists prior to the lithographic patterning of the one or more photoresists to create the stack.

The deposition system 120 performs 220 a deposition of a protective coating on the one or more patterned photoresists. In some configurations, the deposition system 120 performs 220 a conformal deposition of the protective coating. The deposition system 120 performs 230 a back filling of a photoresist on the protective coating.

The etching system 130 performs 240 a partial removal of the back filled photoresist deposited on the protective coating. In some configurations, the manufacturing system 100 repeats the back filling of the photoresist on the protective coating and partial removal of the back filled photoresist for a threshold number (n) of levels. In some embodiments, the etching system 130 performs 250 a selective removal of a volatile photoresist deposited on the substrate to produce an optical grating, including but not restricted to, a diffraction grating, a holographic grating, holographic reflector, or some other optical component that couples an image light into an optical waveguide.

Figure 3:
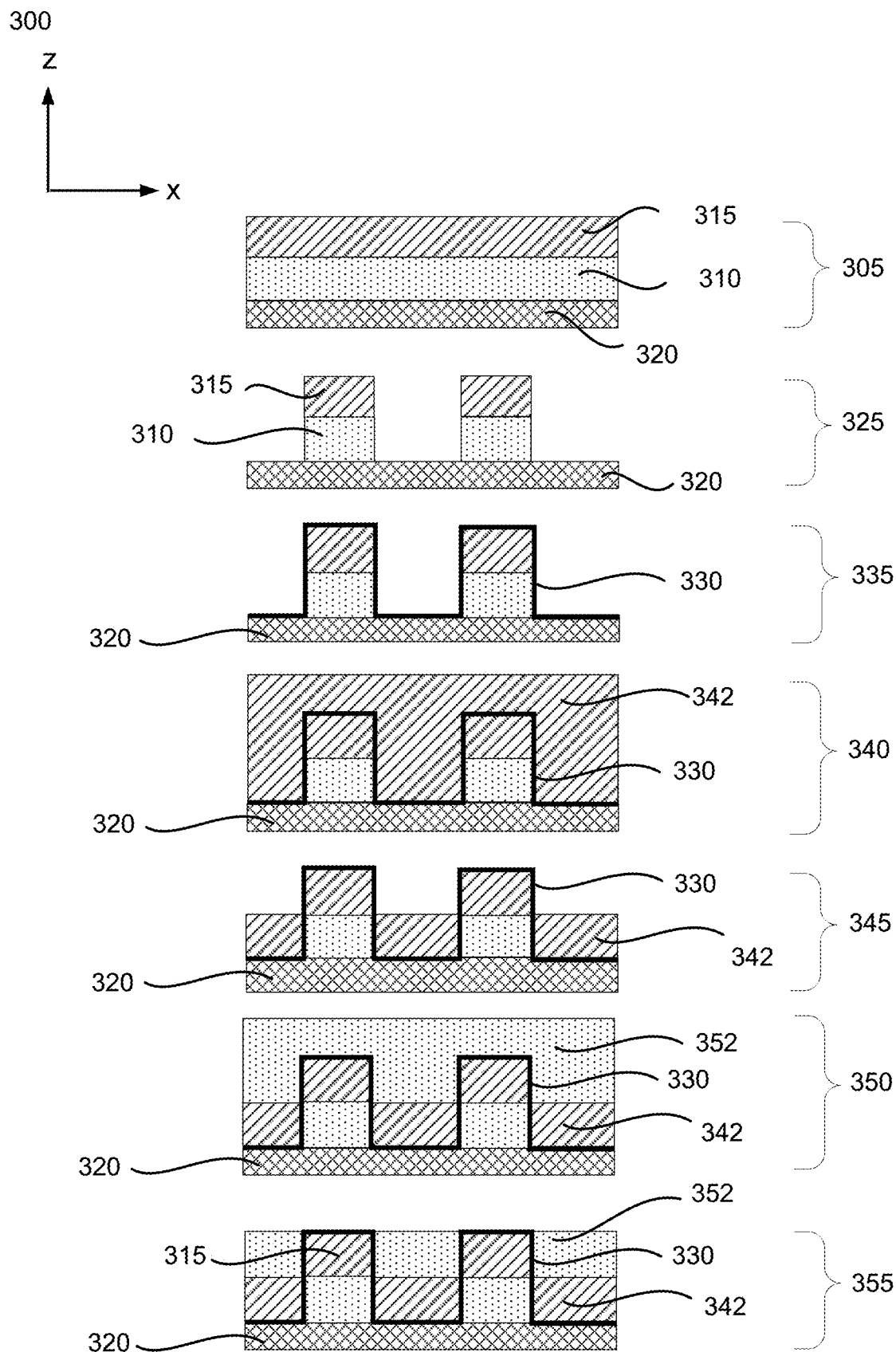
FIG. 3 is an illustration of a self-aligned stacking process of creating an optical grating from a stack including two photoresists, in accordance with one embodiment.

FIG. 3 is an illustration of a self-aligned stacking process 300 of creating an optical grating from a stack including two photoresists, in accordance with one embodiment. The process 300 of FIG. 3 may be performed by the manufacturing system 100. Other entities may perform some or all of the steps of the process in other embodiments. Likewise, embodiments may include different and/or additional steps, or perform the steps in different orders.

The manufacturing system 100 performs 305 a deposition of one or more photoresists on a substrate. For example, the manufacturing system 100 performs a deposition of a first photoresist 310 on an output waveguide 320. The output waveguide 320 is an optical waveguide that outputs image light to an eye of a user, as described below in detail in conjunction with FIG. 9. The manufacturing system 100 performs a deposition of a second photoresist 315 over the first photoresist 310 to form the stack including two photoresists. The self-aligned stacking process 300 forms an optical grating from the stack that couples the image light into a waveguide display, as described in detail below in conjunction with FIG. 9. Each of the first photoresist 310 and the second photoresist 315 in the stack is composed of an organic material such as an imprint resist, a shield resist, etc. In the example of FIG. 3, the first photoresist 310 is a SSQ derivative and the second photoresist 315 is a planarizing organic polymer such as transparent PMMA, PS, etc.

The manufacturing system 100 performs 325 a lithographic patterning of photoresists deposited on the output waveguide 320. In one example, the patterning system 110 uses a single lithographic exposure to pattern the two photoresists. The etching system 130 selectively removes the lithographically exposed regions of the patterned photoresists.

The manufacturing system 100 performs 335 a deposition of a protective coating 330 in a conformal fashion on the patterned photoresists. For example, the deposition system 120 deposits one or more layers of dielectric materials, including, but not restricted to $HfO_2$, $TiO_2$, and $Si_3N_4$ which cannot be removed by the etching system 130. In some configurations, the deposition system 120 deposits the protective coating 330 based on an atomic layer deposition (ALD) process to achieve a threshold value of thickness for each layer of the protective coating 330.

The manufacturing system 100 performs 340 a deposition of a photoresist 342 on the protective coating 330. The photoresist 342 may be composed of the same materials as the second photoresist 315. In some configurations, the deposition system 120 performs 340 a back-filling of the photoresist 342 on the protective coating 330.

The manufacturing system 100 performs 345 a selective removal of the back-filled photoresist 342. In some configurations, the etching system 130 performs 345 the selective removal of the back-filled photoresist 342 to bring the difference between the thickness of the back-filled photoresist 342 and the thickness of the first photoresist 310 to a threshold value closer to zero. In alternate configurations, the etching system 130 performs 345 the selective removal of the back-filled photoresist 342 such that the thickness of the back-filled photoresist 342 is relatively larger than the thickness of the first photoresist 310 by a threshold value.

The manufacturing system 100 performs 350 a deposition of a photoresist 352 on the protective coating 330. The photoresist 352 may be composed of the same materials as the first photoresist 310. In some configurations, the deposition system 120 performs 350 a back-filling of the photoresist 352 on the protective coating 330 such that the thickness of the back-filled photoresist 352 is relatively larger than the thickness of the second photoresist 315 by a threshold value.

In alternate embodiments, the manufacturing system 100 performs 350 a deposition of a first material with a high refractive index including, but not restricted to such as $TiO_2$, $SiN_x$ on the output waveguide 320. The manufacturing system 100 performs a deposition of a second material with a low refractive index including, but not restricted to transparent PMMA, PS, porous $SiO_x$, fluorinated polymers, etc.

The manufacturing system 100 performs 355 a selective removal of the back-filled photoresist 352. In some configurations, the etching system 130 performs 355 the selective removal of the back-filled photoresist 352 until the top surface of the protective coating 330 gets exposed.

The self-aligned stacking process 300 forms an optical grating from the stack created over the output waveguide 320, including but not limited to, a diffraction grating, a holographic grating, a holographic reflector, or some other element that couples an image light into the output waveguide 320, or some combination thereof.

In the example of FIG. 3, the stack including two photoresists is an array of one dimensional grating element. In alternate embodiments, the stack including two photoresists can be scaled to form a two dimensional array of grating elements.

Figure 4:
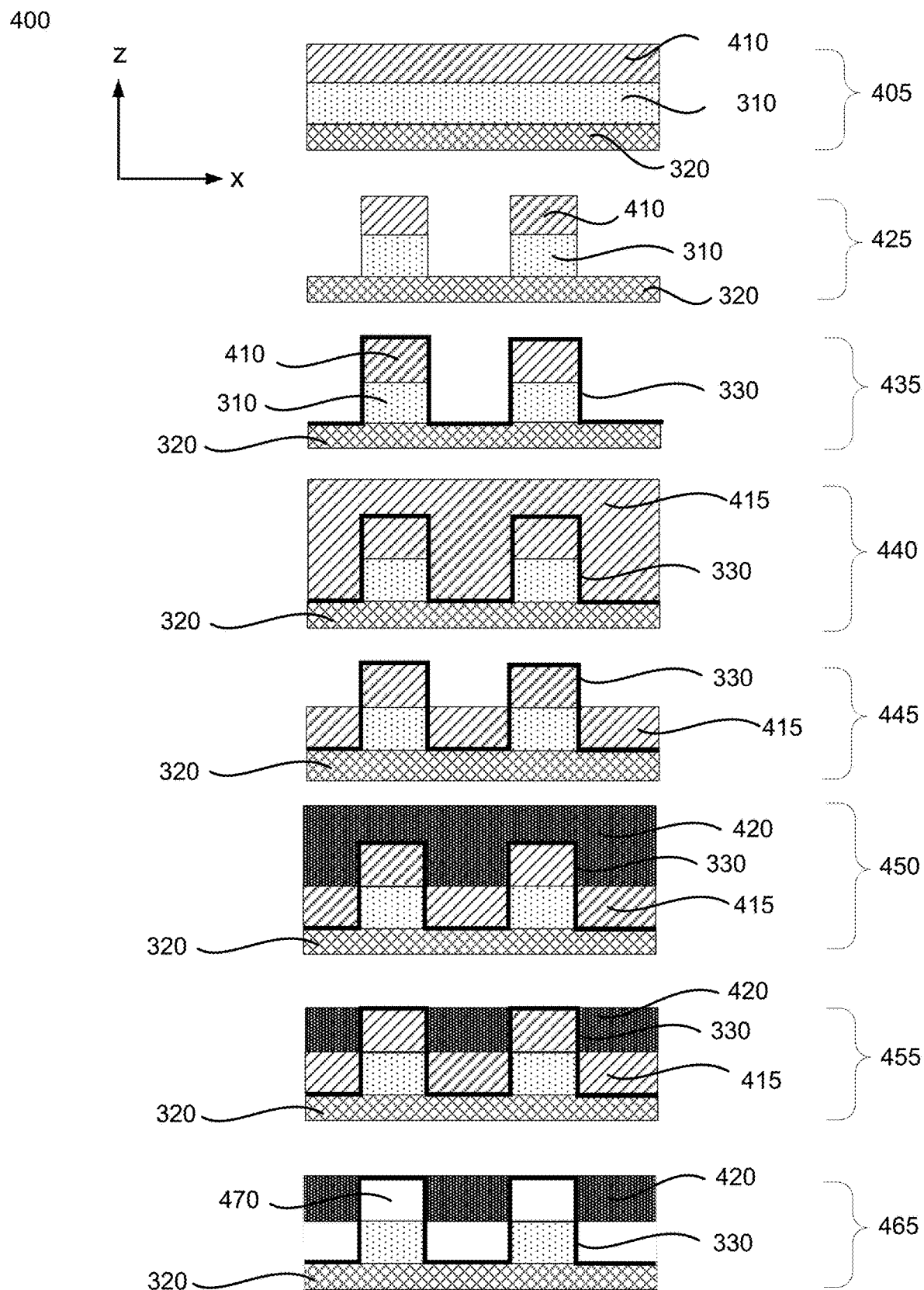
FIG. 4 is an illustration of a self-aligned stacking process with a selective decomposition of the stack of FIG. 3, in accordance with at least one embodiment.

FIG. 4 is an illustration of a self-aligned stacking process 400 with a selective decomposition of the stack of FIG. 3, in accordance with at least one embodiment. The process 400 of FIG. 4 may be performed by the manufacturing system 100. Other entities may perform some or all of the steps of the process in other embodiments. Likewise, embodiments may include different and/or additional steps, or perform the steps in different orders.

The manufacturing system 100 performs 405 a deposition of one or more photoresists on a substrate. For example, the manufacturing system 100 performs a deposition of a first photoresist 310 on an output waveguide 320. The output waveguide 320 is an optical waveguide that outputs image light to an eye of a user, as described below in detail in conjunction with FIG. 9. The manufacturing system 100 performs 4 a deposition of a second photoresist 410 over the first photoresist 310 to form the stack including two photoresists, as described above in conjunction with FIG. 3. Each of the first photoresist 310 and the second photoresist 410 in the stack is composed of an organic material such as an imprint resist, a shield resist, etc. In the example of FIG. 4, the first photoresist 310 is a SSQ derivative and the second photoresist 410 is a planarizing organic polymer such as transparent PMMA, PS, etc.

In some embodiments, the manufacturing system 100 performs 405 a deposition of a first material with a high refractive index including, but not restricted to such as $TiO_2$, $SiN_x$ on the output waveguide 320. The manufacturing system 100 performs 405 a deposition of a second material with a low refractive index including, but not restricted to transparent PMMA, PS, porous $SiO_x$, fluorinated polymers, etc.

The manufacturing system 100 performs 425 a lithographic patterning of the stack including two photoresists. In one example, the patterning system 110 uses a single lithographic exposure to pattern the stack including two photoresists. The etching system 130 selectively removes the lithographically exposed regions of the stack including two photoresists.

The manufacturing system 100 performs 435 a deposition of a protective coating 330 in a conformal fashion on the patterned stack including two photoresists. For example, the deposition system 120 deposits one or more layers of dielectric materials, including, but not restricted to $HfO_2$, $TiO_2$, and $Si_3N_4$ which cannot be removed by the etching system 130. In some configurations, the deposition system 120 deposits the protective coating 330 based on an atomic layer deposition (ALD) process to achieve a threshold value of thickness for each layer of the protective coating 330.

The manufacturing system 100 performs 440 a deposition of a photoresist 415 on the protective coating 330. The photoresist 415 may be composed of the same materials as the second photoresist 410. In some configurations, the deposition system 120 performs 440 a back-filling of the photoresist 415 on the protective coating 330.

The manufacturing system 100 performs 445 a selective removal of the back-filled photoresist 415. In some configurations, the etching system 130 performs 445 the selective removal of the back-filled photoresist 415 to bring the difference between the thickness of the back-filled photoresist 415 and the thickness of the first photoresist 310 to a threshold value closer to zero. In alternate configurations, the etching system 130 performs 445 the selective removal of the back-filled photoresist 415 such that the thickness of the back-filled photoresist 415 is relatively larger than the thickness of the first photoresist 310 by a threshold value.

The manufacturing system 100 performs 450 a deposition of a third photoresist 420 on the protective coating 330. The third photoresist 420 may be composed of the same materials as the first photoresist 310. In some configurations, the deposition system 120 performs 450 a back-filling of the third photoresist 420 on the protective coating 330.

The manufacturing system 100 performs 455 a selective removal of the back-filled third photoresist 420. In some configurations, the etching system 130 performs 455 the selective removal of the back-filled third photoresist 420 until the top surface of the protective coating 330 gets exposed. In a different embodiment, the deposition system 120 performs 450 a back-filling of the first photoresist 310 on the protective coating 330.

The manufacturing system 100 performs 465 a selective decomposition of the photoresist 415. The selective decomposition converts the photoresist 415 into a fourth photoresist 470 based on a thermal process, a photolytic process, or some combination thereof. For example, the manufacturing system 100 performs 465 a selective decomposition of the photoresist 410 based on a thermal decomposition of a decomposable organic polymer. In another example, the manufacturing system 100 performs 465 the selective decomposition of the photoresist 410 based on an irradiation of a light-sensitive organic polymer. In some configurations, the fourth photoresist 470 includes an air gap with a refractive index closer to 1.0.

The self-aligned stacking process 400 forms an optical grating from the stack created over the output waveguide 320, including but not restricted to, a diffraction grating, a holographic grating, a holographic reflector, or some other element that couples an image light into the output waveguide 320, or some combination thereof.

In the example of FIG. 4, the stack including two photoresists is an array of one dimensional grating elements. In alternate embodiments, the stack including two photoresists can be scaled to form a two dimensional array of grating elements.

Figure 5:
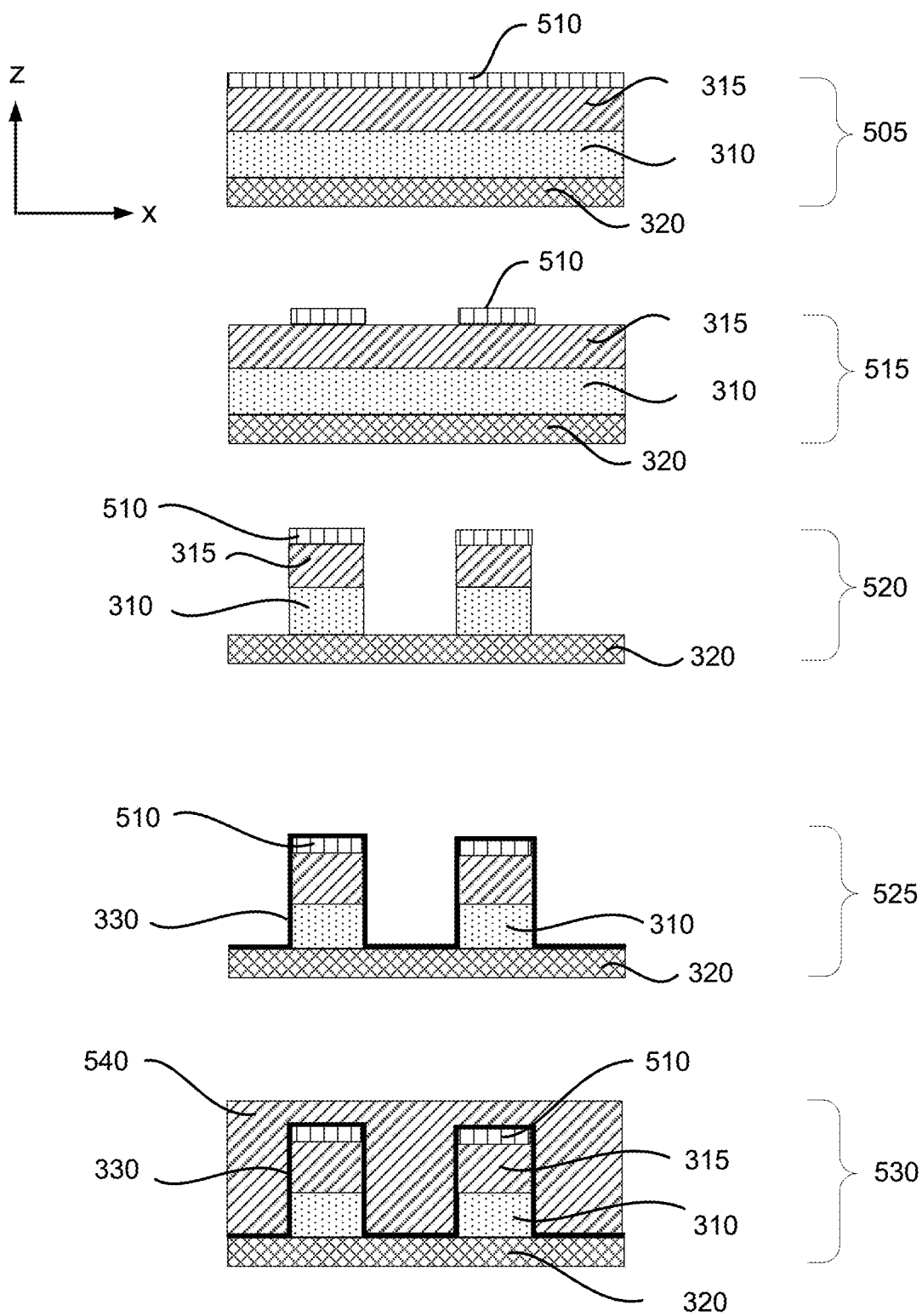
FIG. 5 is an illustration of a self-aligned stacking process of creating an optical grating from a modified stack including a hard mask and two photoresists, in accordance with one embodiment.

FIG. 5 is an illustration of a self-aligned stacking process 500 of creating an optical grating from a modified stack including a hard mask 510 and two photoresists, in accordance with one embodiment. The process 500 of FIG. 5 may be performed by the manufacturing system 100. Other entities may perform some or all of the steps of the process in other embodiments. Likewise, embodiments may include different and/or additional steps, or perform the steps in different orders.

The manufacturing system 100 performs 505 a deposition of one or more materials on a substrate. For example, the manufacturing system 100 performs a deposition of a first photoresist 310 on an output waveguide 320. The output waveguide 320 is an optical waveguide that outputs image light to an eye of a user, as described below in detail in conjunction with FIG. 9. The manufacturing system 100 performs a deposition of a second photoresist 315 on the first photoresist 310. The manufacturing system 100 performs a deposition of the hard mask 510 over the second photoresist 315 to form the modified stack including the first photoresist 310, the second photoresist 315, and the hard mask 510. The hard mask 510 is a layer of protective material deposited over the second photoresist 315. In some configurations, the hard mask 510 is a thin film composed of one or more materials, including, but not restricted to, $HfO_2$, $TiO_2$, $Si_3N_4$, or some combination thereof. Each of the first photoresist 310 and the second photoresist 315 is composed of an organic material such as an imprint resist, a shield resist, etc. In the example of FIG. 5, the first photoresist 310 is a SSQ derivative and the second photoresist 315 is a planarizing organic polymer such as transparent PMMA, PS, etc.

The manufacturing system 100 performs 515 a lithographic patterning of the hard mask 510. In one example, the patterning system 110 uses a single lithographic exposure to pattern the hard mask 510. The patterning system 110 may deposit a layer of photoresist on the hard mask 510 and perform a lithographic exposure to define a portion of the hard mask 510 that must be removed. The etching system 130 selectively removes the lithographically exposed regions of the hard mask 510.

The manufacturing system 100 performs 520 a lithographic patterning of the first photoresist 310 and the second photoresist 315. In one example, the patterning system 110 uses a second lithographic exposure step to transfer the pattern defined on the hard mask 510 onto the first photoresist 310 and the second photoresist 315. The etching system 130 selectively removes the lithographically exposed regions of the first photoresist 310 and the second photoresist 315.

The manufacturing system 100 performs 525 a deposition of the protective coating 330 in a conformal fashion on the patterned and modified stack including the first photoresist 310, the second photoresist 315, and the hard mask 510. For example, the deposition system 120 deposits one or more layers of dielectric materials, including, but not restricted to $HfO_2$, $TiO_2$, and $Si_3N_4$ which cannot be removed by the etching system 130. In some configurations, the deposition system 120 deposits the protective coating 330 based on an atomic layer deposition (ALD) process to achieve a threshold value of thickness for each layer of the protective coating 330.

The manufacturing system 100 performs 530 a deposition of a photoresist 540 on the protective coating 330. The photoresist 540 may be composed of the same materials as the second photoresist 315. In some configurations, the deposition system 120 performs 530 a back-filling of the second photoresist 315 on the protective coating 330.

In some configurations, the manufacturing system 100 performs a selective removal of the photoresist 540. For example, the etching system 130 performs the selective removal of the photoresist 540 to bring the difference between the thickness of the photoresist 540 and the thickness of the first photoresist 310 to a threshold value closer to zero.

In a different embodiment, the manufacturing system 100 performs 505 a deposition of a first material with a high refractive index including, but not restricted to $TiO_2$, $SiN_x$ on the output waveguide 320. The manufacturing system 100 performs 505 a deposition of a second material with a low refractive index including, but not restricted to transparent PMMA, PS, porous $SiO_x$, fluorinated polymers, etc.

In alternate embodiments, the manufacturing system 100 performs a selective decomposition of the first photoresist 310. The selective decomposition converts the first photoresist 310 into a fourth photoresist (not shown here) based on a thermal process, a photolytic process, or some combination thereof. For example, the manufacturing system 100 performs a selective decomposition of the first photoresist 310 based on a thermal decomposition of a decomposable organic polymer. In another example, the manufacturing system 100 performs the selective decomposition of the first photoresist 310 based on an irradiation of a light-sensitive organic polymer. In some configurations, the fourth photoresist includes an air gap with a refractive index closer to 1.0.

The self-aligned stacking process 500 creates an optical grating from the modified stack that couples the image light into a waveguide display, as described in detail below in conjunction with FIG. 9. The self-aligned stacking process 500 forms an optical grating from the modified stack created over the output waveguide 320 including, but not restricted to, a diffraction grating, a holographic grating, a holographic reflector, some other element that couples image light into the output waveguide 320, or some combination thereof.

In the example of FIG. 5, the modified stack including the first photoresist 310, the second photoresist 315, and the hard mask 510 is an array of one dimensional grating elements. In alternate embodiments, the modified stack including the first photoresist 310, the second photoresist 315, and the hard mask 510 can be scaled to form a two dimensional array of grating elements.

Figure 6:
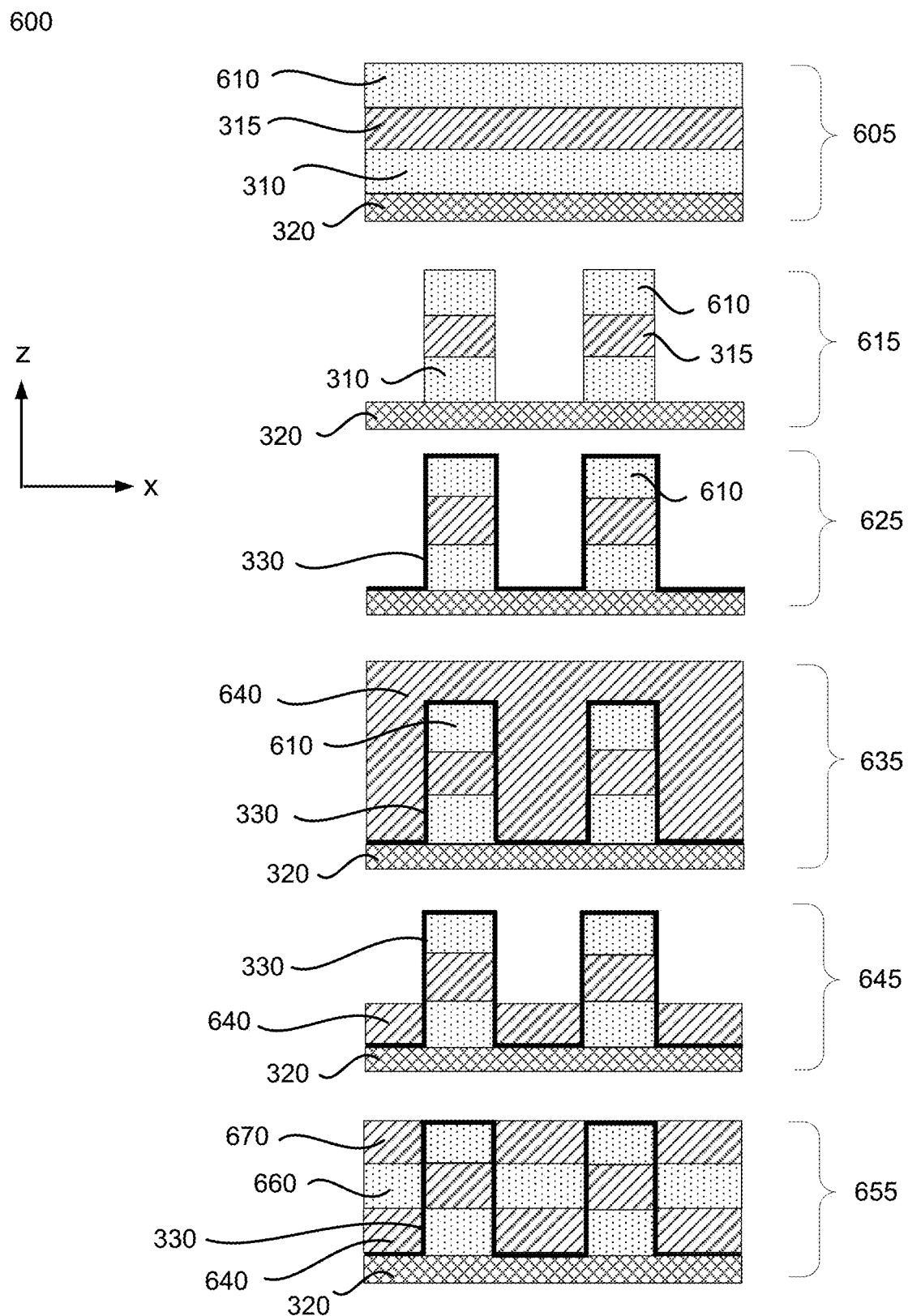
FIG. 6 is an illustration of a self-aligned stacking process of creating an optical grating from a stack including three photoresists, in accordance with one embodiment.

FIG. 6 is an illustration of a self-aligned stacking process 600 of creating an optical grating from a stack including three photoresists, in accordance with at least one embodiment. The process 600 of FIG. 6 may be performed by the manufacturing system 100. Other entities may perform some or all of the steps of the process in other embodiments. Likewise, embodiments may include different and/or additional steps, or perform the steps in different orders.

The manufacturing system 100 performs 605 a deposition of one or more photoresists on a substrate. For example, the manufacturing system 100 performs a deposition of a first photoresist 310 on an output waveguide 320. The output waveguide 320 is an optical waveguide that outputs image light to an eye of a user, as described below in detail in conjunction with FIG. 9. The manufacturing system 100 performs a deposition of a second photoresist 315 over the first photoresist 310. The manufacturing system 100 performs a deposition of a third photoresist 610 over the second photoresist 315 to form a stack including three photoresists. The third photoresist 610 may be composed of the same materials as the first photoresist 310. Each of the first photoresist 310, the second photoresist 315, and the third photoresist 610 in the stack is composed of an organic material such as an imprint resist, a shield resist, etc. In the example of FIG. 3, the first photoresist 310 is a SSQ derivative and the second photoresist 315 is a planarizing organic polymer such as transparent PMMA, PS, etc.

In some embodiments, the manufacturing system 100 performs 605 a deposition of a first material with a high refractive index including, but not restricted to such as $TiO_2$, $SiN_x$ on the output waveguide 320. The manufacturing system 100 performs 605 a deposition of a second material with a low refractive index including, but not restricted to transparent PMMA, PS, porous $SiO_x$, fluorinated polymers, etc. The manufacturing system 100 performs 605 a deposition of a third material with a high refractive index including, but not restricted to such as $TiO_2$, $SiN_x$ on the second material.

The manufacturing system 100 performs 615 a lithographic patterning of the stack including three photoresists. In one example, the patterning system 110 uses a single lithographic exposure to pattern the stack including three photoresists. The etching system 130 selectively removes the lithographically exposed regions of the stack including three photoresists.

The manufacturing system 100 performs 625 a deposition of a protective coating 330 in a conformal fashion on the patterned stack including three photoresists. For example, the deposition system 120 deposits one or more layers of dielectric materials, including, but not restricted to $HfO_2$, $TiO_2$, and $Si_3N_4$ which cannot be removed by the etching system 130. In some configurations, the deposition system 120 deposits the protective coating 330 based on an atomic layer deposition (ALD) process to achieve a threshold value of thickness for each layer of the protective coating 330.

The manufacturing system 100 performs 635 a deposition of a photoresist 640 on the protective coating 330. The photoresist 640 may be composed of the same materials as the second photoresist 315. In some configurations, the deposition system 120 performs 635 a back-filling of the photoresist 640 on the protective coating 330.

The manufacturing system 100 performs 645 a selective removal of the photoresist 640. In some configurations, the etching system 130 performs 645 the selective removal of the photoresist 640 to bring the difference between the thickness of the photoresist 640 and the thickness of the first photoresist 310 to a threshold value closer to zero. In alternate configurations, the etching system 130 performs 645 the selective removal of the photoresist 640 such that the thickness of the photoresist 640 is relatively larger than the thickness of the first photoresist 310 by a threshold value.

The manufacturing system 100 performs 655 a deposition of one or more photoresists on a substrate. For example, the manufacturing system 100 performs a deposition of the photoresist 660 on the photoresist 640. The manufacturing system 100 performs a selective removal of the photoresist 660. The photoresist 660 may be composed of the same materials as the first photoresist 310. In some configurations, the etching system 130 performs the selective removal of the photoresist 660 to bring the difference between the thickness of the photoresist 660 and the thickness of the second photoresist 315 to a threshold value closer to zero. The manufacturing system 100 performs a deposition of a photoresist 670 on the photoresist 660. The photoresist 670 may be composed of the same materials as the first photoresist 310. The manufacturing system 100 performs a selective removal of the photoresist 670. In some configurations, the etching system 130 performs the selective removal of the photoresist 670 until the top surface of the protective coating 330 gets exposed.

The self-aligned stacking process 600 creates an optical grating that couples the image light into a waveguide display, as described in detail below in conjunction with FIG. 9. The self-aligned stacking process 600 forms an optical grating from the stack created over the optical waveguide 320 including, but not restricted to, a diffraction grating, a holographic grating, holographic reflector, some other element that couples an image light into the output waveguide 320, or some combination thereof.

In the example of FIG. 6, the stack including three photoresists is an array of one dimensional grating element. In alternate embodiments, the stack including three photoresists can be scaled to form a two dimensional array of grating elements.

In alternate embodiments, the manufacturing system 100 performs a selective decomposition of the first photoresist 310 and/or the second photoresist 315. The selective decomposition converts the first photoresist 310 and/or the second photoresist 315 into a different photoresist (not shown here) based on a thermal process, a photolytic process, or some combination thereof.

Figure 7:
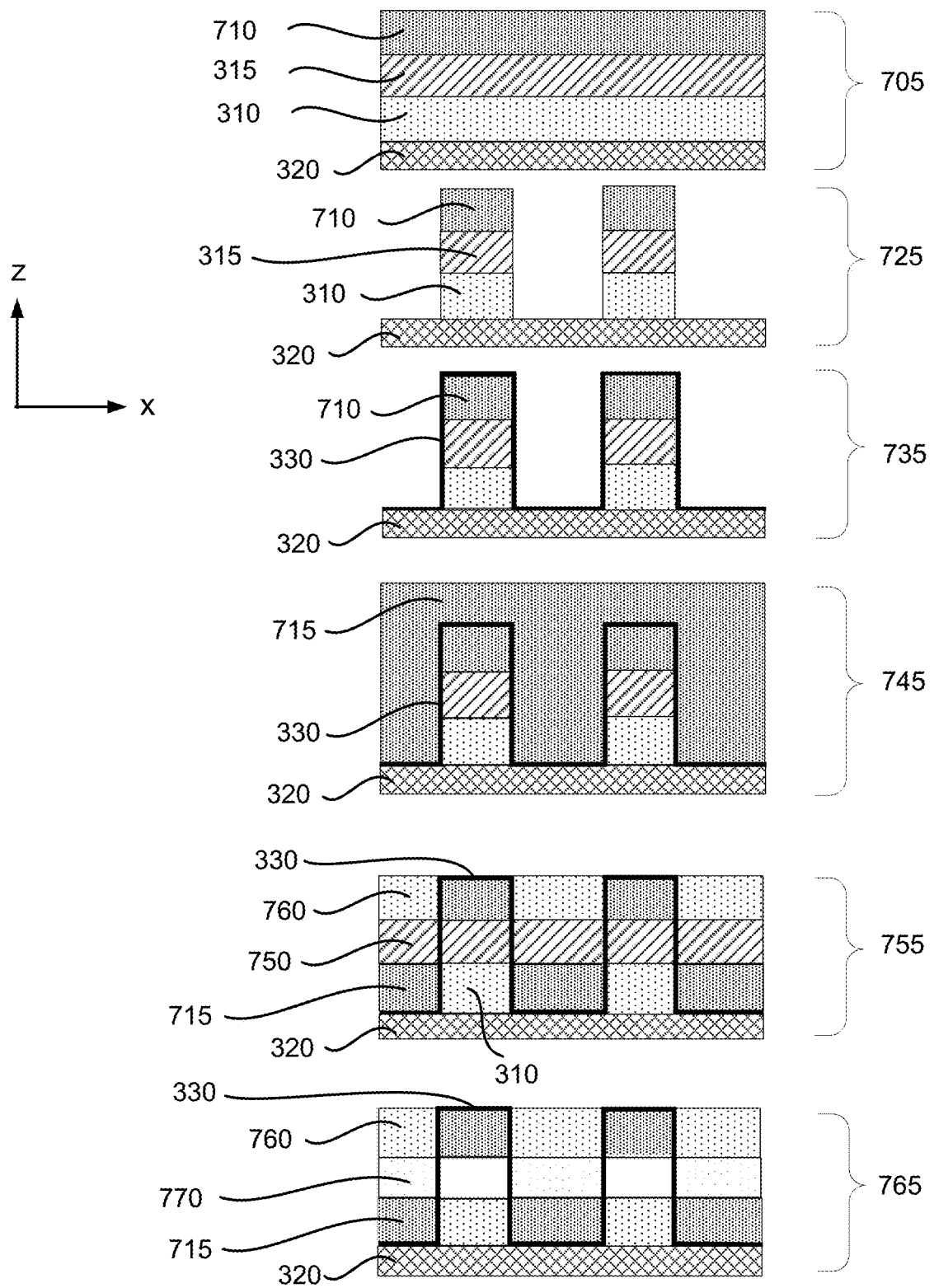
FIG. 7 is an illustration of a self-aligned stacking process with a selective decomposition of the stack of FIG. 6, in accordance with at least one embodiment.

FIG. 7 is an illustration of a self-aligned stacking process 700 with a selective decomposition of the stack of FIG. 6, in accordance with at least one embodiment. The process 700 may be performed by the manufacturing system 100 of FIG. 1. Other entities may perform some or all of the steps of the process in other embodiments. Likewise, embodiments may include different and/or additional steps, or perform the steps in different orders.

The manufacturing system 100 performs 705 a deposition of one or more photoresists on a substrate. For example, the manufacturing system 100 performs a deposition of a first photoresist 310 on an output waveguide 320. The output waveguide 320 is an optical waveguide that outputs image light to an eye of a user, as described below in detail in conjunction with FIG. 9. The manufacturing system 100 performs a deposition of a second photoresist 315 over the first photoresist 310. The manufacturing system 100 performs a deposition of a third photoresist 710 over the second photoresist 315 to form the stack with three photoresists. The self-aligned stacking process 700 creates an optical grating that couples the image light into a waveguide display, as described in detail below in conjunction with FIG. 9. Each of the first photoresist 310, the second photoresist 315, and the third photoresist 710 in the stack is composed of an organic material such as an imprint resist, a shield resist, etc. In the example of FIG. 7, the first photoresist 310 is a SSQ derivative, each of the second photoresist 315 and the third photoresist 710 is a planarizing organic polymer (e.g. transparent PMMA, PS).

In some embodiments, the manufacturing system 100 performs a deposition of a first material with a high refractive index including, but not restricted to such as $TiO_2$, $SiN_x$ on the output waveguide 320. The manufacturing system 100 performs a deposition of a second material with a low refractive index including, but not restricted to transparent PMMA, PS, porous $SiO_x$, fluorinated polymers, etc. The manufacturing system 100 performs a deposition of a third material with a high refractive index including, but not restricted to such as $TiO_2$, $SiN_x$ on the second material.

The manufacturing system 100 performs 725 a lithographic patterning of the stack including three photoresists. In one example, the patterning system 110 uses a single lithographic exposure to pattern the stack including three photoresists. The etching system 130 selectively removes the lithographically exposed regions of the stack including three photoresists.

The manufacturing system 100 performs 735 a deposition of a protective coating 330 in a conformal fashion on the patterned stack including three photoresists. For example, the deposition system 120 deposits one or more layers of dielectric materials, including, but not restricted to $HfO_2$, $TiO_2$, and $Si_3N_4$ which cannot be removed by the etching system 130. In some configurations, the deposition system 120 deposits the protective coating 330 based on an atomic layer deposition (ALD) process to achieve a threshold value of thickness for each layer of the protective coating 330.

The manufacturing system 100 performs 745 a deposition of a photoresist 715 on the protective coating 330. The photoresist 715 may be composed of the same materials as the third photoresist 710. In some configurations, the deposition system 120 performs 745 a back-filling of the photoresist 715 on the protective coating 330.

The manufacturing system 100 performs 755 a selective removal and deposition of one or more photoresists on a substrate. For example, the manufacturing system 100 performs a selective removal of the photoresist 715. In some configurations, the etching system 130 performs the selective removal of the photoresist 715 to bring the difference between the thickness of the photoresist 715 and the thickness of the first photoresist 310 to a threshold value closer to zero. In alternate configurations, the etching system 130 performs the selective removal of the photoresist 715 such that the thickness of the photoresist 715 is relatively larger than the thickness of the first photoresist 310 by a threshold value.

The manufacturing system 100 performs a deposition of a photoresist 750 on the photoresist 715. The photoresist 750 may be composed of the same materials as the second photoresist 315. The manufacturing system 100 performs a selective removal of the photoresist 750. In some configurations, the etching system 130 performs the selective removal of the photoresist 750 to bring the difference between the thickness of the photoresist 750 and the thickness of the second photoresist 315 of the stack including three photoresists to a threshold value closer to zero. The manufacturing system 100 performs a deposition of a photoresist 760 on the photoresist 750. The photoresist 760 may be composed of the same materials as the first photoresist 310. The manufacturing system 100 performs a selective removal of the photoresist 760. In some configurations, the etching system 130 performs the selective removal of the photoresist 760 until the top surface of the protective coating 330 gets exposed.

The manufacturing system 100 performs 765 a selective decomposition of the second photoresist 315 and the photoresist 750. The selective decomposition converts each of the second photoresist 315 and the photoresist 750 into a fourth photoresist 770 based on a thermal process, a photolytic process, or some combination thereof. For example, the manufacturing system 100 performs a selective decomposition of the second photoresist 315 and the photoresist 750 based on a thermal decomposition of a decomposable organic polymer In another example, the manufacturing system 100 performs the selective decomposition of the second photoresist 315 and the photoresist 750 based on an irradiation of a light-sensitive organic polymer. In some configurations, the fourth photoresist 770 includes an air gap with a refractive index closer to 1.0.

The self-aligned stacking process 700 forms an optical grating from the stack created over the output waveguide 320 including, but not restricted to, e.g., a diffraction grating, a holographic grating, holographic reflector, some other element that couples an image light into the output waveguide 320, or some combination thereof.

In the example of FIG. 7, the stack including three photoresists is an array of one dimensional grating element. In alternate embodiments, the stack including three photoresists can be scaled to form a two dimensional array of grating elements.

Figure 8:
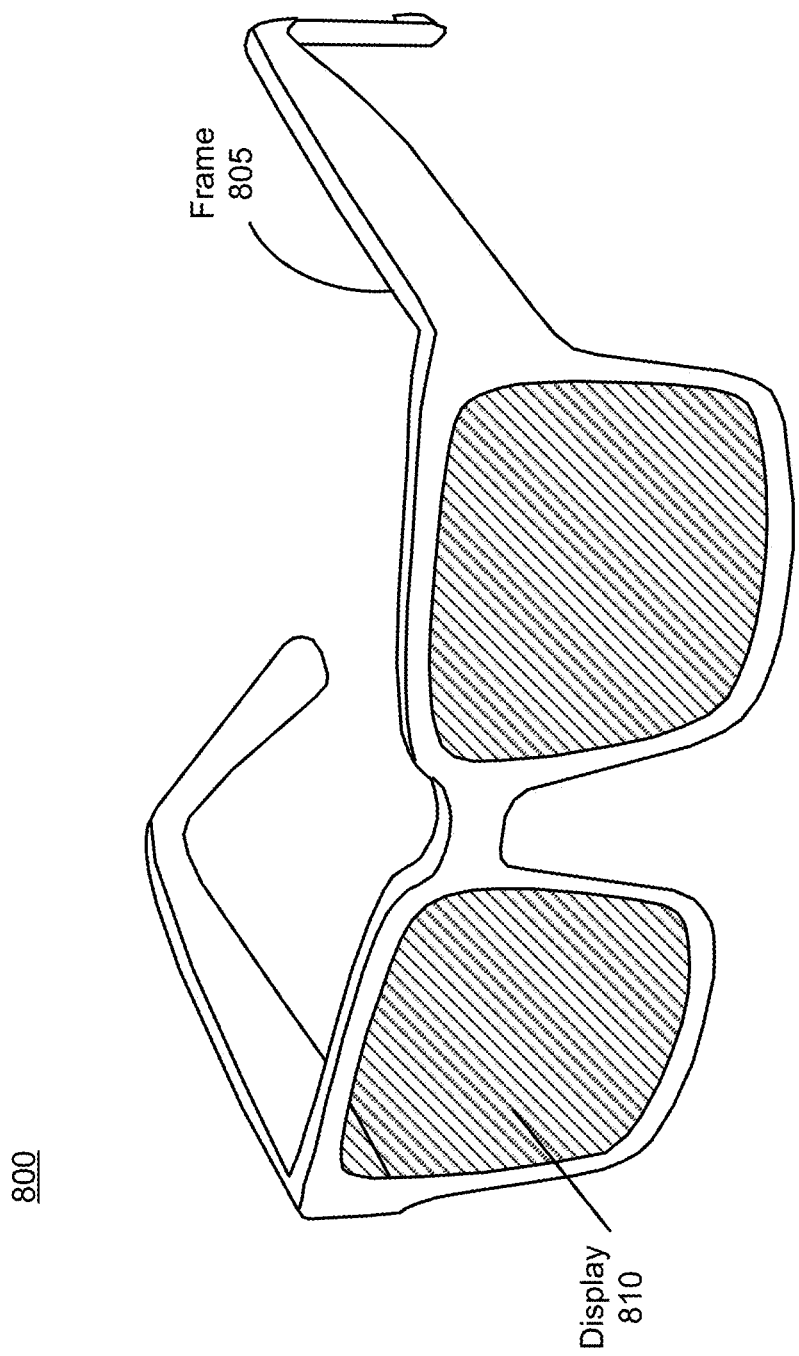
FIG. 8 is a diagram of a near-eye-display (NED) fabricated using the manufacturing system of FIG. 1, in accordance with an embodiment.

FIG. 8 is a diagram of a near-eye-display (NED) 800 fabricated using the manufacturing system of FIG. 1, in accordance with an embodiment. The NED includes one or more displays 810 that include gratings fabricated using the manufacturing system 100, in accordance with an embodiment. The NED 800 presents media to a user. Examples of media presented by the NED 800 include one or more images, video, audio, or some combination thereof. In some embodiments, audio is presented via an external device (e.g., speakers and/or headphones) that receives audio information from the NED 800, a console (not shown), or both, and presents audio data based on the audio information. The NED 800 is generally configured to operate as a VR NED. However, in some embodiments, the NED 800 may be modified to also operate as an augmented reality (AR) NED, a mixed reality (MR) NED, or some combination thereof. For example, in some embodiments, the NED 800 may augment views of a physical, real-world environment with computer-generated elements (e.g., images, video, sound, etc.).

The NED 800 shown in FIG. 8 includes a frame 805 and a display 810. The frame 805 includes one or more optical elements which together display media to users. The display 810 is configured for users to see the content presented by the NED 800. As discussed below in conjunction with FIG. 9, the display 810 includes at least one source assembly to generate an image light to present media to an eye of the user. The source assembly includes, e.g., a source, an optics system, or some combination thereof.

FIG. 8 is only an example of a VR system. However, in alternate embodiments, FIG. 8 may also be referred to as a Head-Mounted-Display (HMD).

Figure 9:
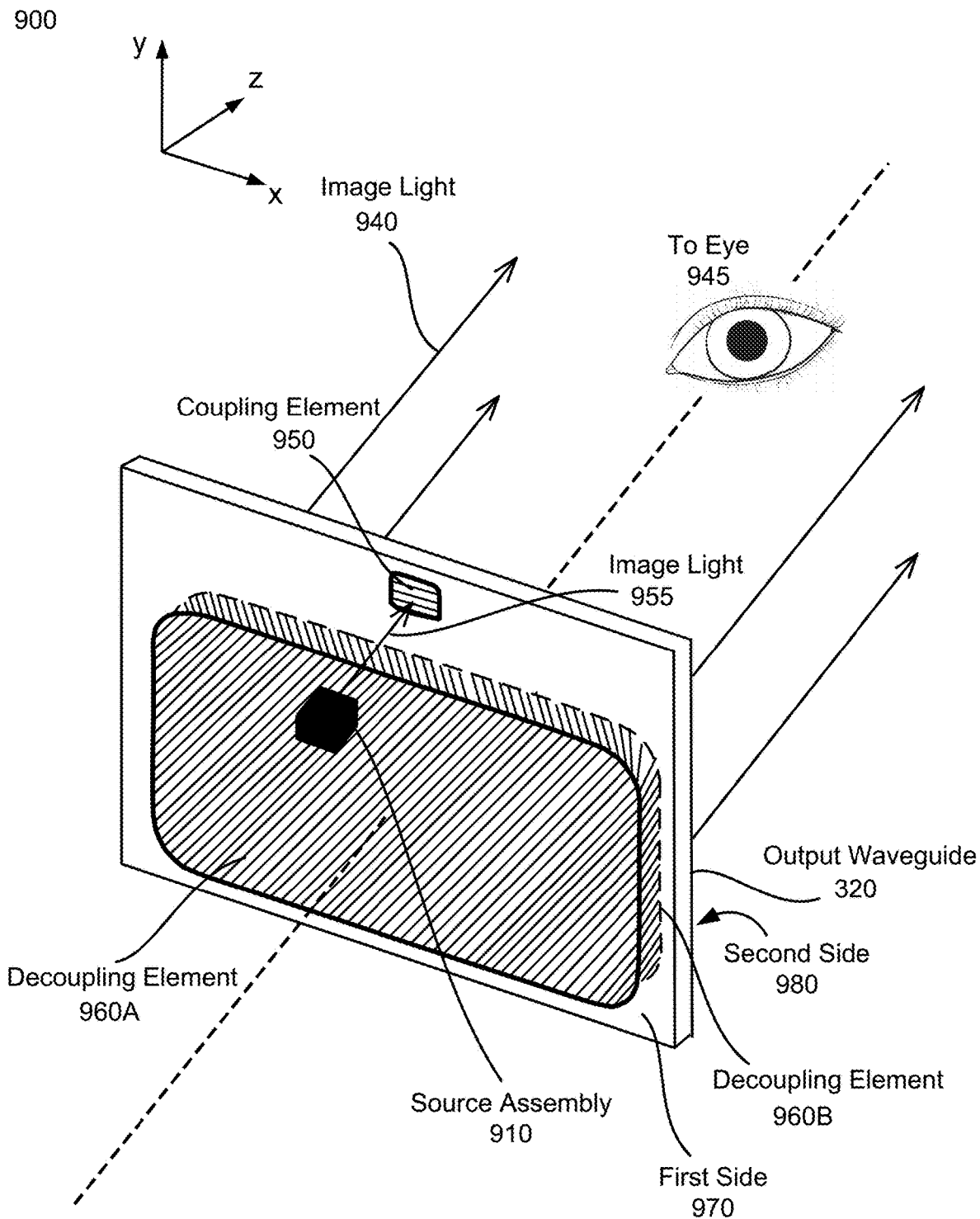
FIG. 9 illustrates an isometric view of a waveguide display fabricated using the manufacturing system of FIG. 1, in accordance with an embodiment.

FIG. 9 illustrates an isometric view of a waveguide display 900 fabricated using the manufacturing system 100 of FIG. 1, in accordance with an embodiment. In some embodiments, the waveguide display 900 (may also be referred to as a scanning waveguide display) is a component of the NED 800. In alternate embodiments, the waveguide display 900 is part of some other NED, or other system that directs display image light to a particular location.

The waveguide display 900 includes a source assembly 910, and an output waveguide 920. The source assembly 910 generates an image light. The source assembly 910 includes a source array and an optics system (not shown here). The source assembly 910 generates and outputs an image light 955 to a coupling element 950 of the output waveguide 920.

The output waveguide 920 is an optical waveguide that outputs image light to an eye 945 of a user. The output waveguide 920 receives the image light 955 at one or more coupling elements 950, and guides the received input image light to one or more decoupling elements 960. In some embodiments, the coupling element 950 couples the image light 955 from the source assembly 910 into the output waveguide 920. The coupling element 950 may be, e.g., a diffraction grating, a holographic grating, some other element that couples the image light 955 into the output waveguide 920, or some combination thereof. In embodiments where the coupling element 950 is diffraction grating, the pitch of the diffraction grating is chosen such that total internal reflection occurs, and the image light 955 propagates internally toward the decoupling element 960. For example, the pitch of the diffraction grating may be in the range of 300 nm to 600 nm. The manufacturing system 100 performs a self-aligned stack into the coupling element 950 to adjust the refractive index as described above in conjunction with FIGS. 1-7.

The decoupling element 960 decouples the total internally reflected image light from the output waveguide 920. The decoupling element 960 may be, e.g., a diffraction grating, a holographic grating, some other element that decouples the image light 940 out of the output waveguide 920, or some combination thereof. In embodiments where the decoupling element 960 is a diffraction grating, the pitch of the diffraction grating is chosen to cause incident image light to exit the output waveguide 920. For example, the pitch of the diffraction grating may be in the range of 300 nm to 600 nm. The manufacturing system 100 performs a self-aligned stack into the decoupling element 960 to adjust the refractive index as described above in conjunction with FIGS. 1-7.

Additional Configuration Information

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A manufacturing system, comprising:
a patterning system configured to perform a lithographic patterning of one or more photoresists to create a stack over a substrate;
a first deposition system configured to perform a conformal deposition of a protective coating on the stack;
a second deposition system configured to perform a deposition of a first photoresist of a first refractive index on the protective coating; and
an etching system configured to perform a removal of the first photoresist to achieve a threshold value of first thickness, wherein
the second deposition system is further configured to perform a deposition of a second photoresist of a second refractive index on the first photoresist, the second refractive index greater than the first refractive index, and
the etching system is further configured to perform a removal of the second photoresist to achieve a threshold value of second thickness to form a portion of an optical grating from the stack created over the substrate.

2. The manufacturing system of claim 1, wherein the stack comprises a first material and a second material deposited over the first material, the second material with a refractive index greater than the first material by a threshold value.

3. The manufacturing system of claim 1, wherein the stack comprises a hard mask deposited over the one or more photoresists.

4. The manufacturing system of claim 1, wherein the optical grating is a sub-wavelength 3D structure created using a single lithographic exposure.

5. The manufacturing system of claim 1, wherein:
the second deposition system is further configured to perform a deposition of a third photoresist of a third refractive index on the second photoresist, the third refractive index different from the first refractive index and the second refractive index; and
the etching system is further configured to perform a removal of the third photoresist to achieve a threshold value of third thickness to form the optical grating.

6. The manufacturing system of claim 1, wherein the etching system is further configured to perform a selective removal of a volatile photoresist in the stack.

7. The manufacturing system of claim 6, wherein the etching system is further configured to perform the selective removal of the volatile photoresist based on a thermal decomposition process.

8. The manufacturing system of claim 6, wherein the etching system is further configured to perform the selective removal of the volatile photoresist by using a photolytic decomposition process.

* * * * *